United States Patent [19]

Ghougasian

[11] Patent Number: 4,527,889
[45] Date of Patent: Jul. 9, 1985

[54] RE-REGISTER ANCHORS FOR FILM SHEET

[76] Inventor: John N. Ghougasian, 2660 Kings Bridge Ter., Bronx, N.Y. 10463

[21] Appl. No.: 569,249

[22] Filed: Jan. 6, 1984

[51] Int. Cl.³ ............................................ G03B 27/32
[52] U.S. Cl. .................................... 355/77; 33/184.5; 355/71; 355/73; 355/76
[58] Field of Search .................. 33/184.5; 355/77, 71, 355/73, 76

[56] References Cited

U.S. PATENT DOCUMENTS

| | | | |
|---|---|---|---|
| 2,473,023 | 6/1949 | Gelb | 355/77 |
| 2,574,392 | 11/1951 | Huebner | 355/71 X |
| 3,506,350 | 4/1970 | Denner | 355/71 X |
| 3,577,856 | 5/1971 | Updegraff | 33/184.5 |
| 3,597,077 | 8/1971 | Dorn | 355/71 |
| 3,758,206 | 9/1973 | Inoue | 355/71 X |
| 3,974,582 | 8/1976 | Jantzen, Jr. | 33/184.5 X |
| 4,080,068 | 3/1978 | Madigan et al. | 355/71 X |
| 4,426,152 | 1/1984 | Sakamoto et al. | 355/77 X |

*Primary Examiner*—Richard A. Wintercorn
*Attorney, Agent, or Firm*—Harvey B. Jacobson

[57] ABSTRACT

A pair of thin panel members are provided having registry posts mounted thereon comprising thin discs punched from a panel sheet. The registry posts are snugly received in registry apertures of the same size formed in remote marginal portions of a film sheet or panel sheet portions tape attached to remote marginal edges of a film sheet and the panel members may then be pressure-sensitive tape applied to the open back of a camera used for copy work. The film sheet may then be exposed, removed from the registry posts and then developed. A second film sheet may thereafter be mounted on the camera back and partially exposed through a contact screen disposed thereover. The contact screen may then be removed and the developed film sheet then may again be mounted on the camera back over the exposed second film sheet through utilization of the registry posts so that the developed film sheet will be in exact registry with the exposed film sheet retained on the camera back. Thereafter, the camera back may be closed and the partially exposed second mentioned film sheet may be further exposed through the developed film sheet after which both film sheets may be removed from the camera and the second film sheet may be developed and have prints made therefrom. A cover panel portion is provided for each post and serves to protect the contact screen.

3 Claims, 8 Drawing Figures

U.S. Patent   Jul. 9, 1985   Sheet 1 of 2   4,527,889
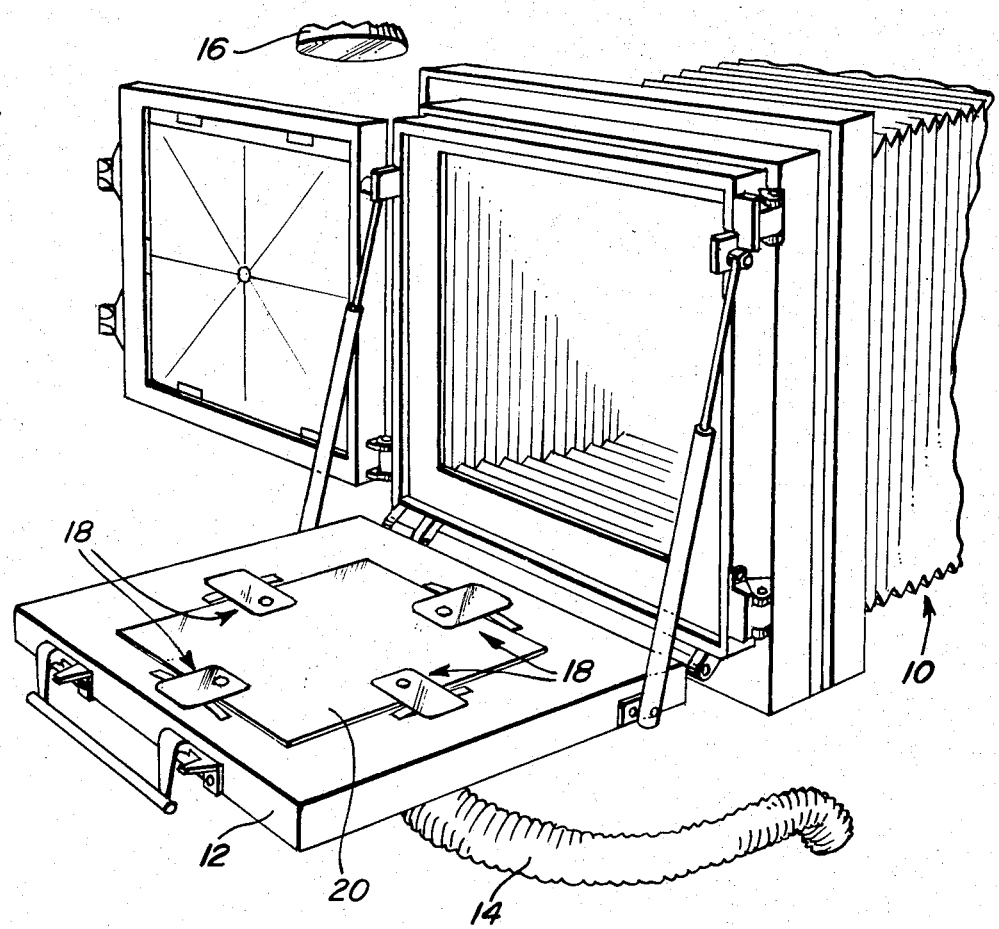
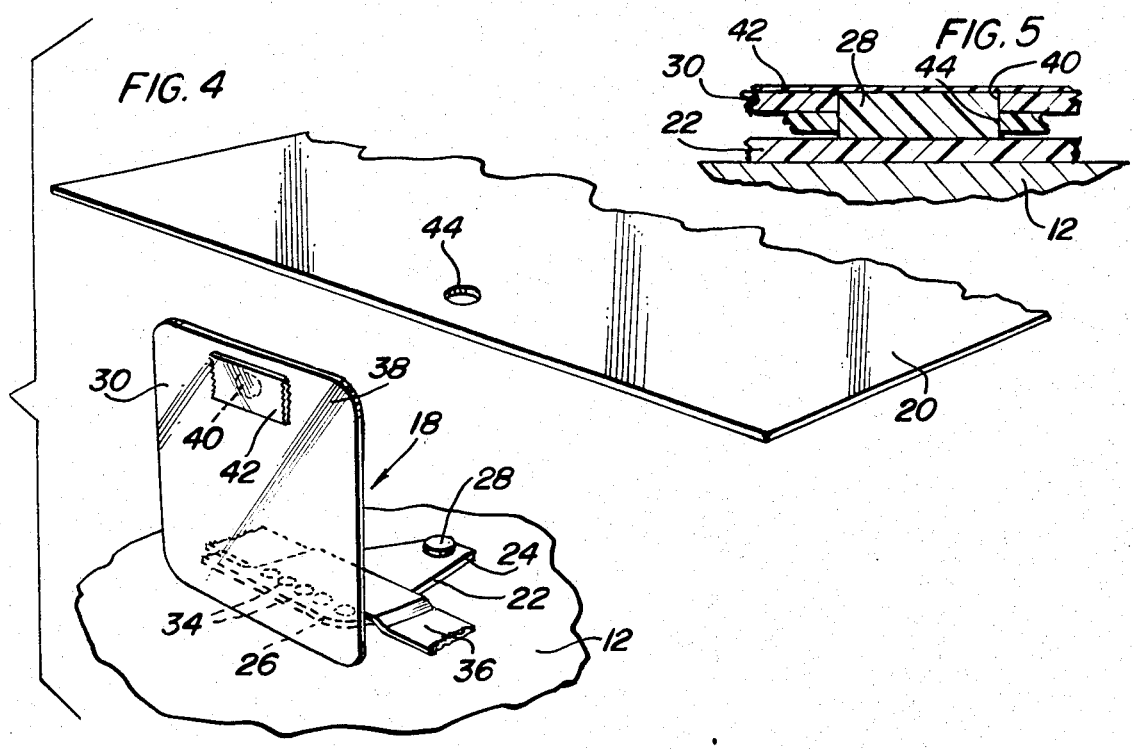

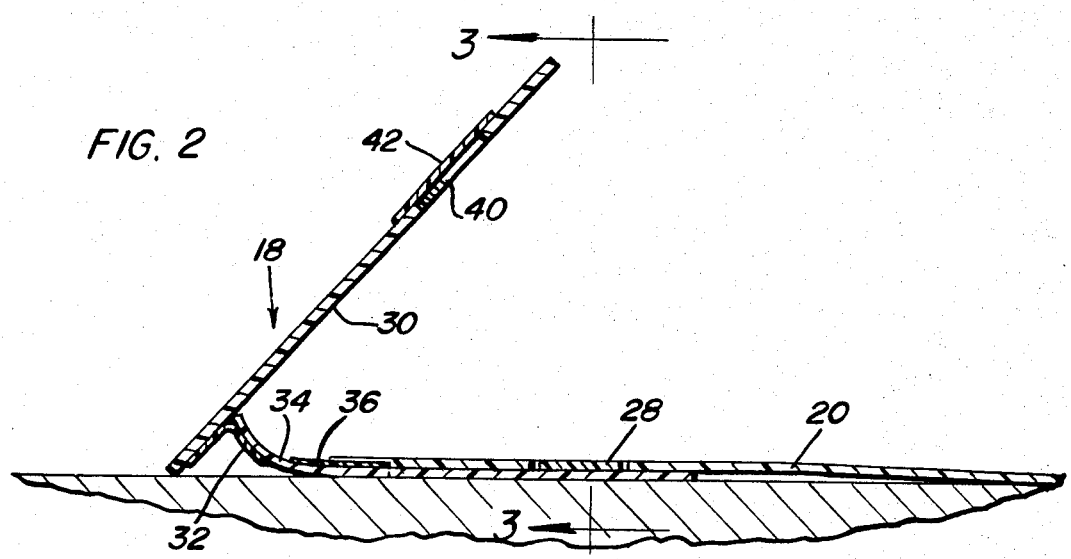
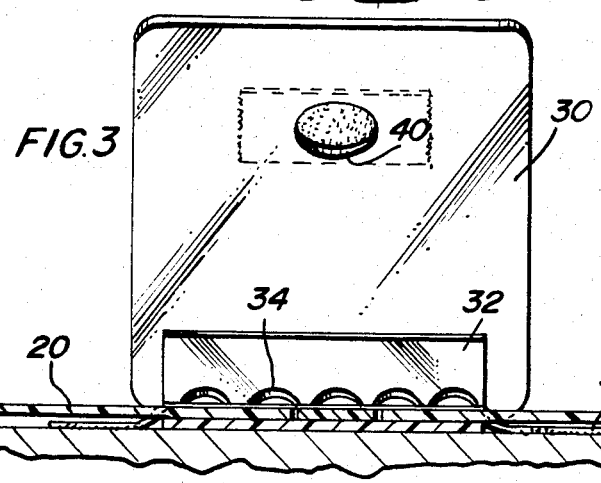
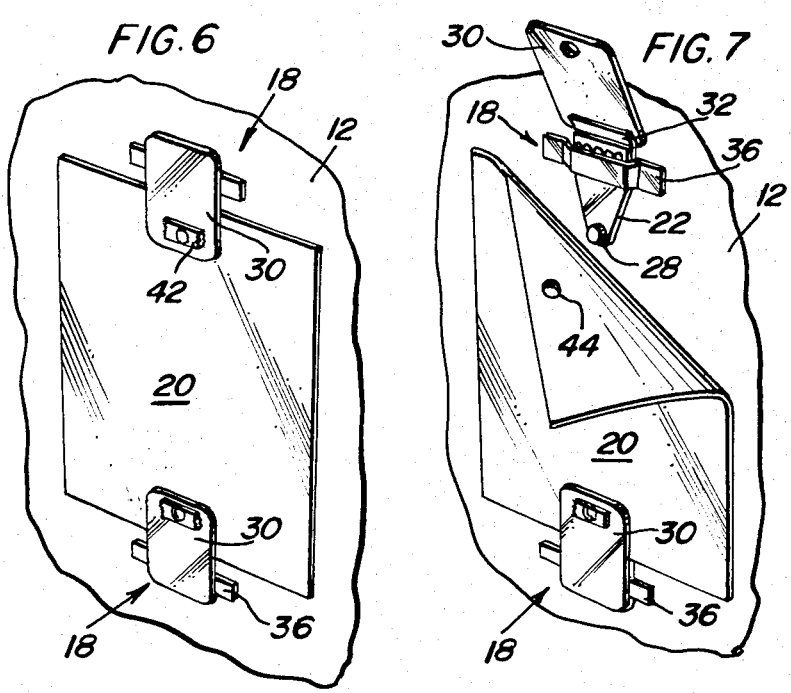
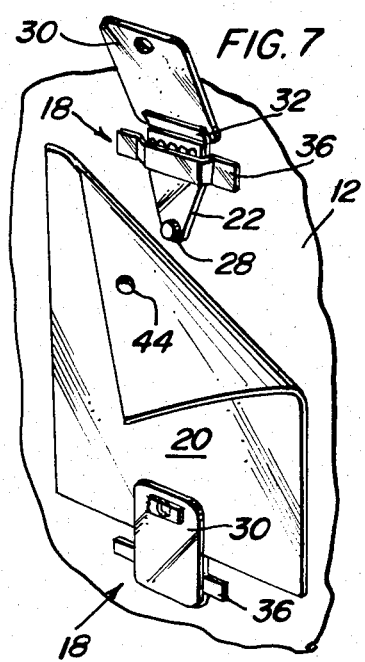
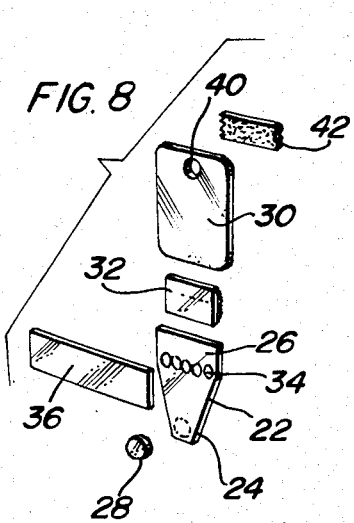

RE-REGISTER ANCHORS FOR FILM SHEET

BACKGROUND OF THE INVENTION

In camera copy work it is often desired to mount a film sheet on a camera back, to subsequently remove that film sheet and to thereafter re-mount the film sheet in precisely the same location on the camera back. Accordingly, various forms of registry pins and other registry structures heretofore have been provided for this purpose. However, these previously known forms of registry pins and other registry devices require either preapertured film sheets, special mounting frames which are not adaptable for use in conjunction with a copy camera back or other structures which are not compatible with screening photography copy work and do not provide protection for a contact screen to be disposed thereover. Accordingly, a need exists for an apparatus which will be capable of allowing successive mounting of a film sheet on a copy camera back in precisely the same location.

Examples of various different forms of registry devices including some of the general structural and operational features of the instant invention are disclosed in U.S. Pat. Nos. 2,760,273, 2,983,049, 3,253,339, 3,625,611, 3,751,817, 3,771,870 and 3,957,371.

BRIEF DESCRIPTION OF THE INVENTION

The re-register anchor of the instant invention is used in pairs and includes a thin panel member tab which may be pressure-sensitive tape secured to the back of a copy camera and which includes a registry post mounted thereon comprising a thin disc punched from a panel sheet of the desired thickness. A film sheet to be mounted on a camera back has remote marginal edge portions thereof randomly punched to provide openings therein of a size and shape to snugly receive the registry posts of a pair of re-register anchors there through. The posts of the re-register anchors are engaged and retained in the openings and the panel member tabs of the re-register anchors are thereafter mounted upon the back of a copy camera through the utilization of pressure-sensitive tape while the registry posts of the tabs remain secured in the film sheet openings. The film sheet may then be exposed and removed from the re-registry anchors while the latter are maintained supported in their original positions on the camera back. The film sheet may then be developed and subsequently re-mounted on the camera back in exactly the same location through utilization of the re-registry anchors.

The re-registry anchors include flap-type cover panels hingedly supported therefrom and equipped with openings therein of a size and shape to snugly receive the registry posts therein. The registry posts are of an axial extent substantially equal to the combined thickness of the aforementioned film sheet and cover panels and the latter are swingable into positions overlying the marginal portions of a film sheet engaged with the registry posts of the re-register anchors. The openings in the cover panels snugly receive those portions of the anchor posts projecting through the associated film sheet and the sides of the cover panels remote from the associated film sheet have pressure-sensitive tape applied over the cover panel openings. In this manner, those portions of the pressure-sensitive tape registered with the cover panel openings adhesively engage the ends of the registry posts remote from the panel members from which they are supported. Thus, the marginal portions of the film sheet which support the re-register anchors are embracingly engaged thereby.

The main object of this invention is to provide structure by which any film sheet initially may be mounted upon a copy camera back, removed therefrom and re-mounted on the camera back in precisely the same position.

Another object of this invention is to provide an apparatus which may be used in conjunction with any camera back and afford contact screen protection.

Still another important object of this invention is to provide an apparatus which may be used in conjunction with different thicknesses of film sheets.

Still another object of this invention is to provide an apparatus which may be used in conjunction with a plurality of superposed film sheets.

A final object of this invention to be specifically enumerated herein is to provide an apparatus in accordance with the preceding objects and which will conform to conventional forms of manufacture, be of simple construction and easy to use so as to provide a device that will be economically feasible, long lasting and relatively trouble free in operation.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a perspective view of a copy camera having a vaccum back and with the back of the camera in an open position and having a film sheet mounted thereon through the use of a pair of re-register anchors constructed in accordance with the present invention;

FIG. 2 is an enlarged fragmentary vertical sectional view of the camera back shown in FIG. 1 and illustrating the cover panel of one of the re-register anchors in an elevated position;

FIG. 3 is a vertical sectional view taken substantially upon the plane indicated by the section line 3—3 of FIG. 2;

FIG. 4 is an exploded perspective view of the structure illustrated in FIG. 2;

FIG. 5 is an enlarged fragmentary vertical sectional view illustrating the manner in which one of the re-registered anchors may embracingly engage an associated film sheet;

FIG. 6 is a perspective view illustrating the manner in which a pair of re-register anchors may be utilized to mount a film sheet on a camera back;

FIG. 7 is a perspective view similar to FIG. 6 and illustrating one of the re-register anchors in the open position and the associated film sheet in a partially removed position; and FIG. 8 is an exploded perspective view of one of the re-register anchors.

DETAILED DESCRIPTION OF THE INVENTION

Referring now more specifically to the drawings the numeral 10 generally designates a camera including a vacuum back 12 to which the inlet end of a flexible vacuum hose 14 is connected. A safe light 16 is mounted over the area occupied when the back 12 is in the open position thereof illustrated in FIG. 1 and a film sheet to be exposed in the camera 10 is mounted on the camera back prior to the latter being closed and the film sheet being exposed within the camera.

The re-register anchors of the instant invention are used in pairs and are referred to in general by the reference numeral 18. The anchors 18 may be used to mount a first film sheet 20 on the back 12 in a manner such that the first film sheet may be initially exposed, removed from the camera and developed and then re-mounted on the camera back in precisely the same position over a second partially exposed film sheet mounted upon the camera back 12 and partially exposed within the camera during the period the first-mentioned film sheet was removed from the camera and being developed.

The re-register anchors each comprise a base panel 22 of stiff but flexible material and including remote marginal edge portions 24 and 26. The marginal edge portion 24 has a register post 28 mounted thereon of a thickness generally twice the thickness of the panel 22 and the edge portion 26 is hinged to the corresponding marginal edge portion of a cover panel 30 of generally the same thickness as the base panel 22. The cover panel 30 is hinged relative to the base panel 22 by a length of pressure-sensitive tape 32. The marginal edge portion 24 includes a plurality of openings 34 formed therein and extending therealong and one marginal edge portion of the tape 32 partially overlies one set of corresponding sides of the openings 34 while a second length of tape 36 is applied over the base panel 22 intermediate the marginal end portions 24 and 26 and extends outwardly from opposite sides of the base panel 22 in order that the ends of the tape 36 may be used to adhesively mount the base panel 22 on the back 12, the tapes 32 and 36 comprising flexible pressure-sensitive tapes.

The cover panel 30 may be swung from the fully open position thereof illustrated in FIG. 4 with the marginal edge portion 26 curving upwardly from the back 12 to a fully closed position such as that illustrated in FIGS. 1, 5 and 6 with the cover panel overlying and substantially paralleling the base panel 22.

The cover panel 30 includes a free swinging marginal edge portion 38 remote from the tape 32 and having an opening 40 punched therein of substantially the same size and shape as the register post 28. When the cover panel 30 is swung to the closed position illustrated in FIGS. 1, 5 and 6, the upper end of the post 28 is snugly received through the opening 40 and the upper side of the cover panel 30 includes a section of tape 42 secured thereover whereby the portion of the tape 42 registered with the opening 40 may engage and adhere to the upper end of the post 28.

In operation, the first film sheet 20 to be mounted on the back 12 has a pair of openings 44 formed in remote marginal edge portions thereof by a punch or other structure operative to dimension the openings 44 of a size and shape to snugly receive the register posts 28 therein. Then, the pair of anchors 18 are embracingly mounted on the marginal edges of the first film sheet 20 provided with the openings 44 and in position thereon with the register posts 28 snugly received through the openings 44 and the tapes 42 adhesively engaged with the free ends of the posts 28. Then, the tapes 36 are used to mount the first film sheet 20 on the back 12. Thereafter, the back 12 is closed and the film sheet 20 is exposed within the camera 10. Subsequently, the back 12 is again opened and the film sheet 20 is removed and developed. Thereafter, a second film sheet is mounted (by vacuum) on the open back 12 and a delicate screen sheet is mounted thereover (also by vacuum). The back 12 is again closed and the second film sheet is partially exposed through the screen after which the back 12 is again opened. At this point, the screen sheet is removed (while maintaining the second partially exposed film sheet in position on the back 12 by vacuum) and the developed first film sheet 20 is re-mounted on the camera back over the partially exposed second film sheet through the utilization of the reregister anchors 18 in order that the developed first film sheet may be precisely registered with the partially exposed second film sheet. Thereafter, the back 12 is again closed and further exposure of the second film sheet is carried out through the developed first film sheet disposed thereover. After exposure of the second film sheet has been accomplished the back 12 is opened and the two film sheets may be removed. The second film sheet may then be developed and the desired photographic prints may be made therefrom. The first film sheet may accept re-touching, lightening or darkening and other image corrections before the second exposure is made to the second film sheet. Further, the range of the original copy print will denote the first film sheet as a positive or a negative image and the first film sheet is primarily made for, and corrected for, the second film sheet.

The foregoing description of use of the re-register anchors 18 comprises only one usage thereof. The re-register anchors 18 also may be used in conjunction with multiple negatives as in four color reproduction work and can be used to interchangeably mount various film sheets for color correcting, balancing or printing purposes.

Further, if for any reason it is desired not to provide the openings 44 in the actual film sheets to be anchored on the back 12 through the utilization of the re-register anchors, scrap pieces of film sheets or the like may be taped to a film sheet to be anchored on the back 12 and provided with openings corresponding to the openings 44. In either event, the film sheet to be anchored on the camera back 12 through the utilization of the re-register anchors 18 will include marginal portions having openings corresponding to the openings formed therein whether the openings are formed in the film sheet itself or scrap pieces of sheet adhesively taped to the film sheet to be mounted.

By using the re-register anchors 18 of the instant invention the more complex re-register structures disclosed in the prior patents hereinbefore previously mentioned may be avoided and structure is provided whereby re-registering of a film sheet on a camera back may be accomplished without any modifications being required to the camera back.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. The method of attaining precise registry of a first film sheet (to be exposed on a camera back and subsequently removed therefrom and developed) with a second subsequently partially exposed film sheet stationarily supported from the camera back, said method comprising:

A. providing an opening in at least two remote marginal panel portions of the first film sheet;
B. attaching a pair of tab anchors to said film sheet including registry posts supported therefrom of a size to be snugly received in said openings and of a length to project slightly through said openings;
C. releasably randomly attaching said tab anchors, while the latter remain attached to said first film sheet, to said camera back while the latter is open;
D. closing said camera back;
E. exposing said first film sheet;
F. opening said camera back;
G. removing said first film sheet from said tab anchors while the latter remain releasably attached to said camera back;
H. stationarily supporting a second film sheet on said camera back;
I. closing said back;
J. partially exposing said second film sheet;
K. opening said back;
L. developing said first film sheet between steps G and L; and
M. re-mounting said first film sheet on said back over said second film sheet through the use of said tab anchors.

2. The method of claim 1 wherein step H includes placing cover sheet portions over the exposed ends of said posts.

3. The method claim 2 wherein step J includes partially exposing the second film sheet through a contact screen and step K includes removal of said contact screen.

* * * * *